(12) United States Patent
Lili et al.

(10) Patent No.: US 6,992,611 B1
(45) Date of Patent: Jan. 31, 2006

(54) DC-COUPLED WIDEBAND SIGNAL CONVERTERS

(75) Inventors: Tomas Lili, Jamestown, NC (US); James Hand, Jr., Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/066,806

(22) Filed: Feb. 25, 2005

(51) Int. Cl.
*H03M 1/38* (2006.01)
(52) U.S. Cl. ...................... 341/161; 341/120
(58) Field of Classification Search ................ 341/161, 341/120
See application file for complete search history.

(56) References Cited

U.S. PATENT DOCUMENTS

| | | | | |
|---|---|---|---|---|
| 5,327,131 A | * | 7/1994 | Ueno et al. .................. | 341/136 |
| 5,394,148 A | * | 2/1995 | Matsuura et al. ........... | 341/161 |
| 5,410,274 A | | 4/1995 | Birdsall et al. ............. | 330/265 |
| 5,422,889 A | | 6/1995 | Sevehans et al. .......... | 370/95.3 |
| 5,589,831 A | * | 12/1996 | Knee ......................... | 341/159 |
| 5,742,448 A | * | 4/1998 | Hamahata et al. ......... | 360/96.5 |
| 5,864,310 A | | 1/1999 | Khorramabadi ............. | 341/118 |
| 6,229,472 B1 | * | 5/2001 | Nishida ....................... | 341/161 |
| 6,515,542 B1 | | 2/2003 | Wang et al. .................. | 330/69 |
| 6,753,801 B2 | * | 6/2004 | Rossi .......................... | 341/161 |
| 6,909,391 B2 | * | 6/2005 | Rossi .......................... | 341/161 |

OTHER PUBLICATIONS

Paterson, Sally, "Maximize Performance when Driving Differential ADCs", EDN Magazine, Jun. 12, 2003, pp. 69-72.
Gerstenhaber, Moshe, et al., "ADC Interface Conditions High-Level Signals", EDN Magazine, Oct. 30, 2003, pp. 96-97.
Application Note: "High-Speed ADC Sets Input Common-Mode Range", Maxim Dallas Semiconductor, Aug. 22, 2003.

* cited by examiner

*Primary Examiner*—John B. Nguyen
*Assistant Examiner*—Lam T. Mai
(74) *Attorney, Agent, or Firm*—Koppel, Jacobs, Patrick & Heybl

(57) ABSTRACT

Signal converters are provided that accurately process dc-coupled source signals in the presence of different predetermined voltage and current source requirements. Processing structures are described that satisfy these requirements while providing accurate control of common mode levels along a processing path and accurate reduction of converter offset errors.

20 Claims, 2 Drawing Sheets

DC-COUPLED WIDEBAND SIGNAL CONVERTERS

BACKGROUND OF THE INVENTION

1. Field of the Invention

The present invention relates generally to analog-to-digital converters.

2. Description of the Related Art

It has been found that processing signals differentially provides a number of advantages. For example, noise generation along a signal path is reduced by differential processing because it substantially rejects any noise that appears as common mode voltage. In addition, differential processing tends to cancel even-order signal harmonics so that signal distortion is significantly reduced.

Some signal sources, however, provide only single-ended source signals so that some sort of signal conditioning must be done to convert these signals to differential signals for further processing. In addition, there are situations which demand that source signals be processed along dc-coupled signal paths. For example, a receiver may provide signals for signal conditioning that cover a wide range of frequencies which begin at baseband.

Accurate processing of dc-coupled signals is difficult because of various effects such as the variation of component values over time and temperature. There exists a need, therefore, for accurate dc-coupled signal converters which can process single-ended signals having various voltage and current levels.

BRIEF SUMMARY OF THE INVENTION

The present invention is directed to dc-coupled signal converters that accurately process single-ended source signals having a variety of different parameters. The novel features of the invention are set forth with particularity in the appended claims. The invention will be best understood from the following description when read in conjunction with the accompanying drawings.

DETAILED DESCRIPTION OF THE INVENTION

Figure 1:
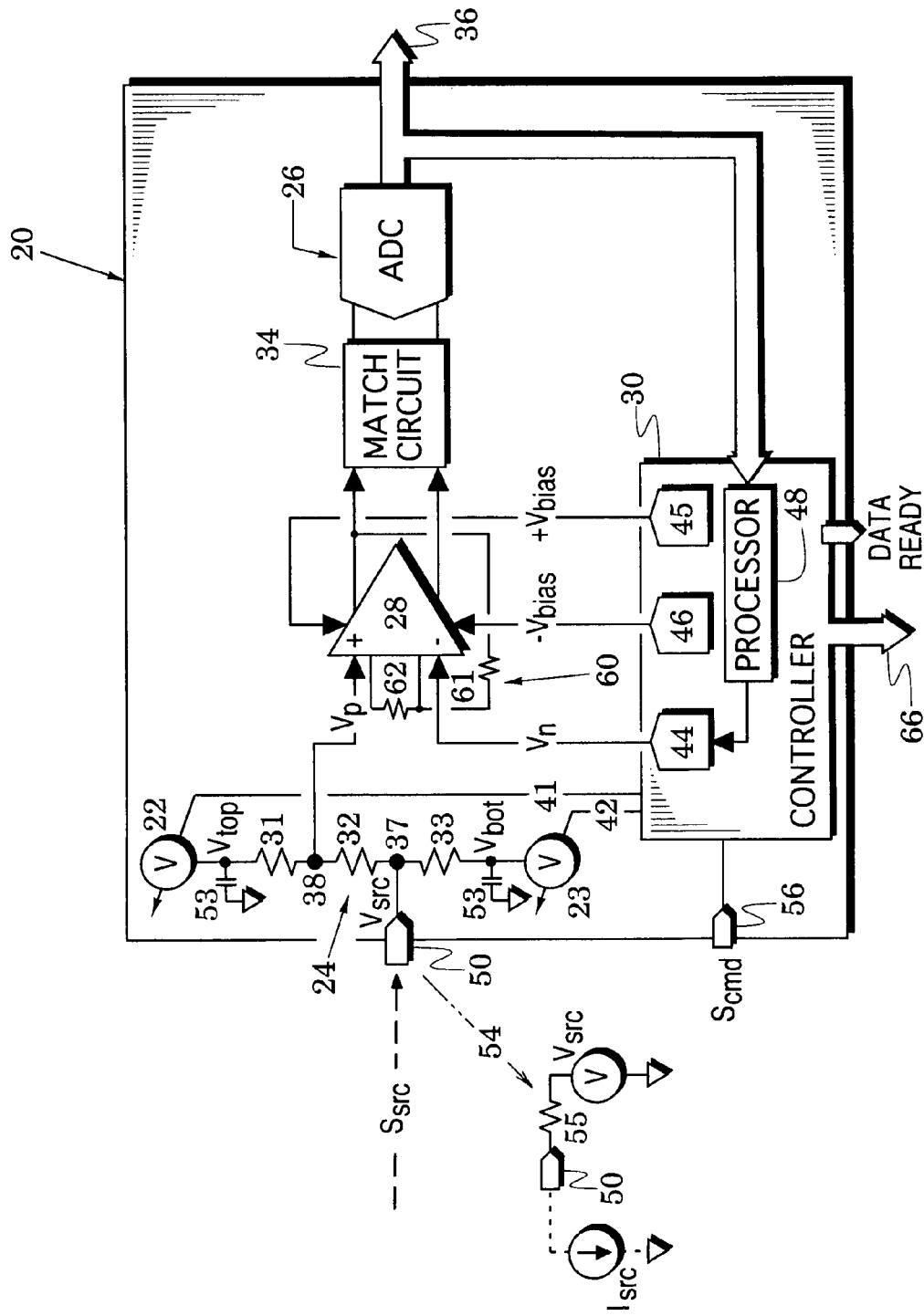
FIG. 1 is a diagram of a dc-coupled signal converter embodiment of the present invention.
Figure 2:
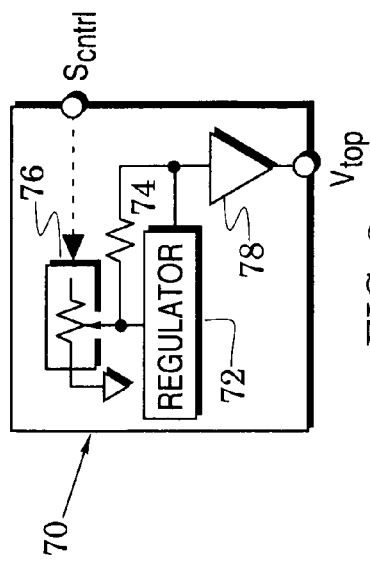
FIG. 2 is a diagram of an adjustable voltage source embodiment for use in the converter of FIG. 1.
Figure 3:
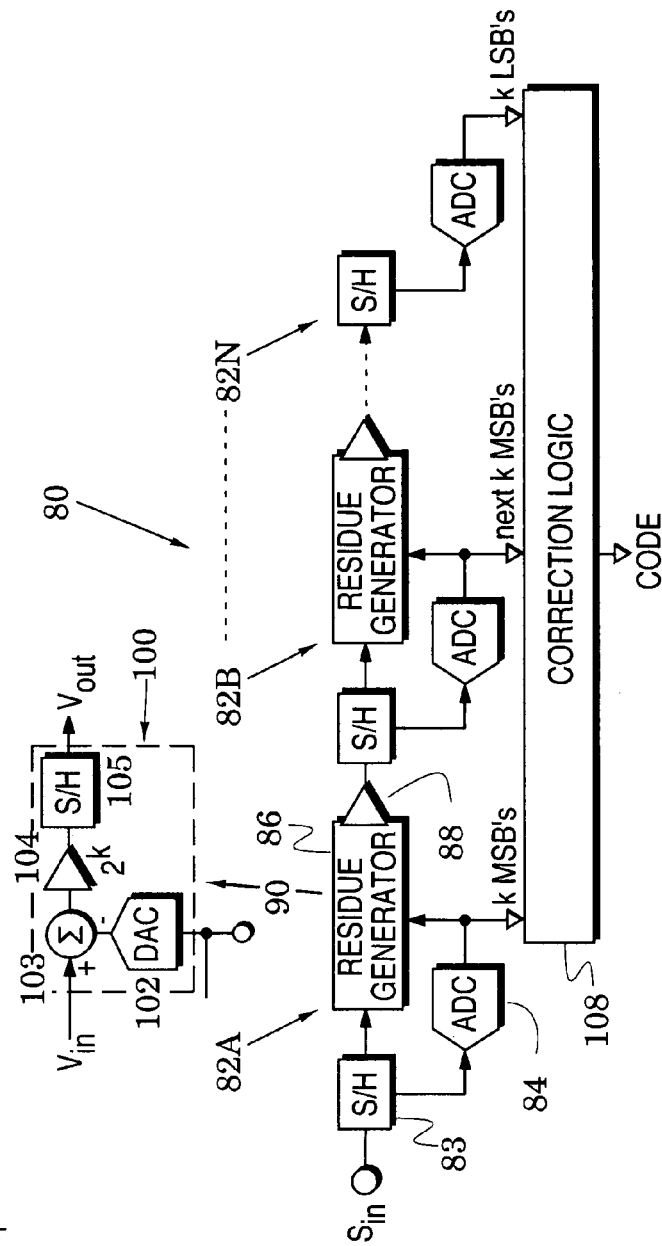
FIG. 3 is a diagram of a pipelined analog-to-digital converter embodiment for use in the converter of FIG. 1.

FIGS. 1–3 illustrate converter structures that accurately process source signals in the presence of different predetermined voltage and current source requirements. In addition, the processing includes accurate control of common mode levels along a processing path and accurate reduction of converter offset errors. This accurate control facilitates DC coupling of signals and realization of wide bandwidth operation.

In particular, FIG. 1 illustrates a signal converter 20 that includes at least one adjustable voltage source 22, a string 24 of resistors, an analog-to-digital converter (ADC) 26, a differential amplifier 28 coupled between the string 24 and the ADC 26, and a controller 30 that provides control signals to elements of the signal converter. In the particular converter embodiment of FIG. 1, the string 24 includes first, second and third resistors 31, 32 and 33 coupled between first and second voltage sources 22 and 23. The embodiment of FIG. 1 also inserts an impedance matching circuit 34 between the differential amplifier 28 and the ADC 26.

The differential amplifier 28 has upper and lower bias ports, upper and lower input ports and a differential output port that provides differential analog signals in response to signals at the input ports. The ADC 26 converts the differential analog signals to digital signals that exit over a digital bus 36 which is configured to also provide the digital signals to the controller 30.

A junction between the second and third resistors defines a first string tap point 37 and a junction between the first and second resistors defines a second string tap point 38 which is coupled to the upper input port of the differential amplifier 28. The controller 30 provides control signals 41 and 42 to the first and second adjustable voltage sources 22 and 23 and, in response, they generate voltages $V_{top}$ and $V_{bot}$ at the top and bottom of the resistor string 24.

The upper input port of the differential amplifier 28 receives a voltage signal $V_p$ from the second tap point 38 and the controller 30 provides, via a digital-to-analog converter (DAC) 44, an offset correction signal $V_n$ to the lower input port of the differential amplifier (in the embodiment shown, the upper and lower input ports are the positive and negative input ports). To control common mode levels, the controller also provides (via DACs 45 and 46) bias signals $+V_{bias}$ and $-V_{bias}$ to the upper and lower bias ports of the differential amplifier 28. Preferably, the controller 30 includes a digital processor 48 which generates (via the DAC 44) the offset correction signal $V_n$ in response to the digital signals from the ADC 26.

In an exemplary application of the signal converter 20, a signal source (not shown) applies analog source signals $S_{src}$ through a source port 50 which is coupled to the first tap point 37. Paths to ground for these source signals are provided by capacitors 53 at each end of the resistor string.

In exemplary applications of the signal converter 20, the signal source is structured to drive a predetermined impedance and to receive any selected one of a set of predetermined source voltages $V_{src}$ and predetermined source currents $I_{src}$ from the source port 50. An equivalent arrow 54 points to an equivalent circuit in which the signal source represents a current source that pulls the predetermined source current $I_{src}$ through the predetermined impedance 55 (e.g., 50 ohms) from a voltage source that provides the predetermined source voltage $V_{src}$. In addition, proper processing of the analog source signals $S_{src}$ of the signal requires a dc signal path through the signal converter 20 and it is, accordingly, structured for this processing.

In operation of the signal converter 20, command signals $S_{cmd}$ are provided to the controller 30 through a command port 56 to specify present values of the predetermined source voltage $V_{src}$ and source current $I_{src}$. In response to the command signals $S_{cmd}$, the controller 30 adjusts, via control signals 41 and 42, the voltage sources 22 and 23 so that they generate voltages $V_{top}$ and $V_{bot}$ at the top and bottom of the resistor string 24 that will provide the commanded source voltage $V_{src}$ and source current $I_{src}$.

It is noted that values of the resistors in the string 24 have typically been previously determined in accordance with the expected set of predetermined source voltages and source currents. That is, these values are determined so that the signal converter can generate any voltage and current combination of the set.

The voltage signal $V_p$ from the second tap point 38 now represents a common mode level and signals are preferably processed about this level as they pass through the differential amplifier 28 and ADC 26. Accordingly, the controller 30 adjusts, via DACs 45 and 46, the bias signals $+V_{bias}$ and $-V_{bias}$ to be equally spaced about the voltage signal $V_p$ and thereby cause the common mode input and output levels of the differential amplifier 28 to agree with the voltage signal $V_p$ at the second tap point 38. Preferably, the difference between the bias signals $+V_{bias}$ and $-V_{bias}$ is maintained at a level (e.g., 5 volts) that is compatible with the internal configuration of the differential amplifier 28.

As stated above, the command signal $S_{cmd}$ at the command port 56 specifies present values of the predetermined source voltage and source current and these values lie in range that is compatible with the current values and structure of the resistor string 24. The resistor string is configured so that the voltage signal $V_p$ at the second tap point 38 will also lie in a range that is compatible with the common mode range of the ADC 26. When the controller 30 adjusts the common mode input and output level of the differential amplifier 23 to agree with the voltage signal $V_p$, it is therefore known that this common mode level will fall within the allowed range of the ADC 26.

To facilitate generation of the required command signals 41 and 42 and bias signals $+V_{bias}$ and $-V_{bias}$, the controller 30 may store (e.g., in a lookup table) values that have been previously determined for all combinations of the present set of predetermined source voltages and source currents. If voltages and currents are required that do not fall in this current set, a different embodiment of the signal converter 20 would have different resistor values installed.

The controller 30 preferably includes a digital processor 48 that is configured to determine any offset error in the conversion process of the ADC 26. In an exemplary method, the source signal is removed or turned off so that only random noise is present at the input of the differential amplifier. The amplifier gain is stored in the controller so that the total signal gain along the conversion path is also known.

With the aid, for example, of a stored algorithm, the processor 48 examines the digital signals on the digital bus 36 and determines an offset error that is referenced to the input of the differential amplifier 28. The processor then adjusts the offset correction signal $V_n$ at the amplifiers negative input to substantially null the offset error.

For each given command signal $S_{cmd}$, the signal converter 20 thus provides the commanded source voltage $V_{src}$ and source current $I_{src}$ at the source port 50, provides bias signals $+V_{bias}$ and $-V_{bias}$ to realize amplifier and ADC common-mode levels that conform to the voltage signal $V_p$ at the second tap point 38, and applies an offset correction signal $V_n$ to the differential amplifier 28 that reduce offset errors in said digital signals.

It was previously noted that the offset correction included the signal gain of the differential amplifier 28. Because the input signal is coupled from the second tap point 38 to the upper input port of the differential amplifier, the amplifier is in a single-ended-to-differential operating mode. To balance the differential output signals, an amplifier bias network 60 thus includes a feedback resistor 61. The network also includes a gain resistor 62 selected to obtain the desired gain. Some differential amplifiers provide feedback and gain ports that differ from the differential input ports and FIG. 1 is illustrated with such an amplifier.

It was also noted above that an impedance matching circuit may be inserted between the differential amplifier 28 and the ADC 26. This circuit may be formed with conventional elements (e.g., resistors, inductors and capacitors) and structured to enhance the match between the ADC's input impedance and the driving impedance of the differential amplifier.

In a different signal converter embodiment, the controller 30 of FIG. 1 is configured to convert the digital signals from the ADC 26 to differential signals (e.g., low-voltage differential signaling (LVDS) signals) and to provide these output signals at an output port 66. These differential signals are especially suited to minimize switching and crosstalk noise and to facilitate the transmission of higher data rates. As shown, the controller 30 can also be configured to provide a data ready signal which indicates that the controller has completed all of the functions described above and that the signals at the output port 66 are valid. This signal is useful for setting the timing of external systems that receive the differential output signals.

Although the variable voltage sources 22 and 23 of FIG. 1 can be configured in various embodiments, an exemplary embodiment 70 is shown in FIG. 2 to include a regulator 72, a feedback resistor 74, a digitally-controlled rheostat 76 and a buffer amplifier 78. The regulator 72 is configured to provide a voltage at the input to the buffer 78 that conforms to a reference signal that is generated at a junction between the feedback resistor 72 and the rheostat 76.

When the resistance of the rheostat is reduced, for example, by the control signal $S_{cntrl}$, the ratio of the voltage at the buffer 78 to the reference signal is increased and, accordingly, the voltage at the buffer is increased. Thus, the structure of FIG. 2 provides an adjustable voltage source in which the magnitude of the output voltage is a function of the control signal $S_{cntrl}$ (which can be one of the control signals 41 and 42 of FIG. 1).

The ADC 26 of FIG. 1 can be realized in a number of embodiments. For example, FIG. 3 illustrates a pipelined ADC system 80 that is formed with a plurality of converter stages 82A, 82B, - - - 82N. Except for the last stage, each converter stage samples an analog signal, provides at least one corresponding digital bit, and passes to a subsequent stage a residue that represents the difference between each sample and an analog signal that corresponds to the provided digital bit (i.e., an estimate of the sample). Although the signal paths through the converter stages are differential signal paths, they are shown as single lines in FIG. 3 so that structural details do not obscure the converter concepts.

FIG. 3 shows that a typical converter stage 82A includes a sampler 83 (designated S/H for sample and hold), an ADC 84, a residue generator 86 and an amplifier 88. In operation of this converter stage, the sampler 83 provides samples of an analog input signal $S_{in}$ at a clocked rate. The ADC 84 converts each sample to k of the most significant bits (MSB's). The residue generator 86 converts the k MSB's to an analog estimate (estimate of the analog sample) and subtracts this analog estimate from the input signal $S_{in}$ to form a residue signal that can be passed to a subsequent converter stage for derivation of further bits.

To enhance conversion accuracy, the residue signal is preferably "gained up" in the amplifier 88 so that the analog window presented to the subsequent stage is substantially that of the present stage. Because the final converter stage 82N provides the final least significant bits (LSB's), it does not require the residue generator of preceding stages.

Example arrow 90 indicates that an exemplary residue generator is a multiplying digital-to-analog converter (MDAC) 100 that includes a DAC 102, a summer 103, an amplifier 104 (with gain $2^k$) and another sampler 105. The DAC 102 forms the analog estimate, the summer 103 forms the residue by subtracting the analog estimate from the preceding analog sample, and the amplifier 104 amplifies the residue with gain $2^k$. Finally, the sampler 105 provides analog samples to the succeeding converter stage at the clock rate.

In an exemplary realization, the initial converter stage generates a predetermined number of MSB's, the final converter stage generates a predetermined number of LSBs and a plurality of intermediate converter stages each provide 1.5 bits. As shown in FIG. 3, correction logic 108 uses the inherent redundancy of these determined bits to provide a final accurate digital code.

MDAC's have been configured with various structures such as switched-capacitor structures that present a capacitor to receive a charge from a preceding stage in one portion of a sample time span. In a second portion of this time span, the capacitor is switched to transfer its charge into another capacitor that is coupled about a high-gain amplifier. The received and transferred charges form the "gained-up" residue signal.

It was stated above that a signal source may be structured to receive any selected one of a set of predetermined source voltages $V_{src}$ and predetermined source currents $I_{src}$ from the source port 50. An exemplary set of source voltages is 0.3, 0.35, 0.4, 0.45 and 0.5 volts and, for each of these voltages, an exemplary set of source currents includes 4, 5, 6 and 7 milliamps.

It was also stated above that the voltage signal $V_p$ at the second tap point 38 should lie in a range that is compatible with the common mode range of the ADC 26. An exemplary common mode range is 0.25 to 1.75 volts. For this common mode range and the exemplary set of source voltages and currents recited above, an exemplary set of the resistors 31, 32 and 33 of FIG. 1 were configured with values of 465.5, 44.2 and 56.2 ohms.

It is noted that the string 24 is configured to provide an offset between the desired common mode level of the voltage signal $V_p$ and the predetermined source voltages $V_{src}$. Although the string of FIG. 1 is shown to offset positive levels of common mode and source voltages, other signal converter embodiments may be structured to offset negative levels or mixed positive and negative levels. Other embodiments of the resistor string 24 may have a number of resistors greater than that shown in FIG. 1.

It was further stated above that the processor 48 can analyze the digital signals on the bus 36, determine an offset error, and generate (via the DAC 44) an offset correction signal $V_n$. This operation is preferably done when the source signal is removed or turned off so that only random noise is present at the input of the differential amplifier 28. In an exemplary 12 bit signal converter, it has been found that the offset can be controlled to be less than +/−4 LSBs.

Signal converter structures have been described that accurately process source signals in the presence of different predetermined voltage and current source requirements. The processing also includes accurate control of common mode levels along a processing path and accurate reduction of converter offset errors to thereby facilitate DC coupling of signals and realization of wide bandwidth (e.g., 750 MHz) operation.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A signal converter, comprising:
   a differential amplifier having first and second bias ports, first and second input ports, and a differential output port that provides differential analog signals in response to signals at the input ports;
   at least one converter stage that converts said differential analog signals to digital signals;
   at least one adjustable voltage source;
   a string of resistors coupled to said voltage source and defining first and second tap points with said second tap point coupled to said first input port; and
   a controller configured to adjust said voltage source to provide predetermined voltage and current at said first tap point, to provide first and second bias voltages to said first and second bias ports to realize amplifier common-mode levels that conform to a voltage at said second tap point, and to apply an offset correction signal to said second input port to reduce offset errors in said digital signals.

2. The converter of claim 1, wherein said at least one adjustable voltage source comprises first and second adjustable voltage sources coupled to opposite ends of said string.

3. The converter of claim 1, wherein said string comprises three of said resistors with said first and second tap points defined by opposite ends of a middle one of said resistors.

4. The converter of claim 1, wherein said controller includes a digital processor that provides said offset correction signal in response to said digital signals.

5. The converter of claim 4, wherein said controller further includes:
   first and second analog-to-digital converters that provide said first and second bias voltages;
   a digital processor that derives a digital offset error in said digital signals; and
   a third analog-to-digital converter that converts said digital offset error to said offset correction signal.

6. The converter of claim 1, wherein each of said adjustable voltage sources includes a digital rheostat that responds to said controller.

7. The converter of claim 1, further including an impedance matching circuit inserted between said amplifier and said converter.

8. A signal converter, comprising:
   a differential amplifier having first and second bias ports, a first input port, and a differential output port that provides differential analog signals in response to signals at said input port;
   an analog-to-digital converter that converts said differential analog signals to digital signals;
   at least one adjustable voltage source;
   a string of resistors coupled to said voltage source and defining first and second tap points with said second tap point coupled to said first input port; and
   a controller configured to adjust said voltage source to provide predetermined voltage and current at said first tap point, and to provide first and second bias voltages to said first and second bias ports to realize amplifier common-mode levels that conform to a voltage at said second tap point.

9. The converter of claim 8, wherein:
   said differential amplifier has a second input port and said differential output port provides differential analog signals in response to signals at said first and second input ports; and said controller is configured to apply an offset correction signal to said second input port to reduce offset errors in said digital signals.

10. The converter of claim 9, wherein said controller further includes:
   first and second analog-to-digital converters that provide said first and second bias voltages;
   a digital processor that derives a digital offset error in said digital signals; and
   a third analog-to-digital converter that converts said digital offset error to said offset correction signal.

11. The converter of claim 8, wherein said at least one adjustable voltage source comprises first and second adjustable voltage sources coupled to opposite ends of said string.

12. The converter of claim 8, wherein said string comprises three of said resistors with said first and second tap points defined by opposite ends of a middle one of said resistors.

13. The converter of claim 8, wherein each of said adjustable voltage sources includes a digital rheostat that responds to said controller.

14. The converter of claim 8, wherein said analog-to-digital converter includes pipelined converter stages.

15. The converter of claim 8, wherein said string is configured to present an impedance of substantially 50 ohms.

16. The converter of claim 8, further including an impedance matching circuit inserted between said amplifier and said converter.

17. A signal converter, comprising:
   a differential amplifier having first and second bias ports, first and second input ports, and a differential output port that provides differential analog signals in response to signals at said input ports;
   a converter system that converts said differential analog signals to digital signals;
   at least one adjustable voltage source;
   a string of resistors coupled to said voltage source and defining first and second tap points with said second tap point coupled to said first input port; and
   a controller configured to adjust said voltage source to provide predetermined voltage and current at said first tap point, to provide first and second bias voltages to said first and second bias ports to realize amplifier common-mode levels that conform to a voltage at said second tap point, and to apply an offset correction signal to said second input port to reduce offset errors in said digital signals.

18. The converter of claim 17, wherein said converter system includes:
   a plurality of serially connected converter stages in which at least one of said stages includes:
      a) a comparator system that converts a respective portion of said differential analog signals to at least one corresponding digital bit of said digital signals; and
      b) a residue generator that provides another portion of said differential analog signals to a subsequent one of said converter stages in the form of a residue signal which said generator generates in response to said respective portion and said corresponding digital bit.

19. The converter of claim 17, wherein said at least one voltage source comprises first and second adjustable voltage sources coupled to opposite ends of said string.

20. The converter of claim 17, wherein said controller includes a digital processor that provides said offset correction signal in response to said digital signals.

* * * * *